INTERCONNECTION SYSTEM FOR A CIRCUIT BOARD ASSEMBLY

Filed May 3, 1967 2 Sheets-Sheet 1

INVENTOR.
DAVID J. CRIMMINS
BY
Kenyon & Kenyon
ATTORNEYS

April 21, 1970 D. J. CRIMMINS 3,508,187

INTERCONNECTION SYSTEM FOR A CIRCUIT BOARD ASSEMBLY

Filed May 3, 1967 2 Sheets-Sheet 2

INVENTOR.
DAVID J. CRIMMINS
BY
Kenyon & Kenyon
ATTORNEYS

United States Patent Office 3,508,187
Patented Apr. 21, 1970

3,508,187
INTERCONNECTION SYSTEM FOR A CIRCUIT BOARD ASSEMBLY

David J. Crimmins, Pennington, N.J., assignor to Thomas & Betts Corporation, a corporation of New Jersey
Filed May 3, 1967, Ser. No. 635,732
Int. Cl. H05k *7/08, 1/06*
U.S. Cl. 339—17 11 Claims

ABSTRACT OF THE DISCLOSURE

The interconnection system includes a flat cable having rolled conductors therein which are stripped and connected to the circuit paths of a circuit board. The conductors are soldered directly to the circuit paths or indirectly through contact pins. The ends of the flat cable are held in connectors to avoid strain or rupturing of the conductors at the circuit paths.

This invention relates to an interconnection system for a circuit board assembly. More particularly, this invention relates to a direct conductor termination interconnection system. Still more particularly, this invention relates to a variable pitch flat cable interconnection system for a printed circuit board assembly.

Systems for interconnecting circuit board assemblies have been known which have been of a flexible etched type, that is, of the type having a conductive metal, such as copper, etched within a plastic carrying medium. However, these systems have been found to be unreliable in many instances as well as being of unsatisfactory quality. In some instances where these flexible etched systems have been connected to a circuit board, the conductor etchings have terminated in pins which have been crimped to the etchings. The pins which have usually been grouped together in fours have then been subsequently soldered to a printed circuit board. These pins, however, have had no provision for strain relief of the flexible etching so that small amounts of flexing have resulted in a ruptured conductor at the rear of the pins. In other instances where the etchings of a flexible etched system have been soldered to a printed circuit board a fillet solder technique has been used. In these instances, since the preparation of an etching with the copper conductor free of insulation on both sides has been difficult, the etchings have been prepared for soldering by exposing the conductors on one side only and folding the exposed conductors under the etching. Then, a fillet solder has been made between the exposed conductors and the circuit board. However, the only joint has been made through the solder fillet.

Generally, the invention provides an interconnection system which provides a higher degree of reliability than heretofore known systems while also providing a very economical system. The system utilizes a flat cable having a plurality of insulated conductors which are of fully annealed copper. The cable which is produced in a continuous process without requiring etching, has a spread pitch end and a fine pitch end. The spread pitch end is attached to a series of pins of a connector and the fine pitch end is soldered to a connector card with a strain relief.

Each conductor of the spread pitch end is stripped of insulation on all sides and lap soldered to the pins of the connector. Thus, crimping of the conductors is avoided as well as any damage that might occur with crimping methods. In addition, the connector strain relieves the flat cable so that any flexing of the cable is not transmitted to the conductors at the pins.

Alternatively, each conductor of the spread pitch end can be tinned and placed upon the pins of the connector in a manner so that the pins can be crimped in a non-electric manner without damage taking place. Thereafter, the pins of the connector can be inserted into a printed circuit board so that the conductors in the flat cable can be soldered directly to the conductor path of the board. This alternative eliminates a joint at the back of the pins while providing strain relief to the system. In addition, soldering of the flat cable conductors to the pins is eliminated.

Accordingly, it is an object of the invention to provide a flat cable interconnection system for a circuit board assembly.

It is another object of the invention to provide a non-etched interconnection system.

It is another object of the invention to provide a low cost interconnection system having a minimum of solder joints.

It is another object of the invention to provide an improved reliable joint on the connection board end of a cable of an interconnection system for a printed circuit board assembly.

It is another object of the invention to prevent conductor breakage upon flexing of an interconnection system for a circuit board assembly.

These and other objects and advantages of the invention will become more apparent from the following detailed description and appended claims taken in conjunction with the accompanying drawings in which:

Figures 1, 2, 3:
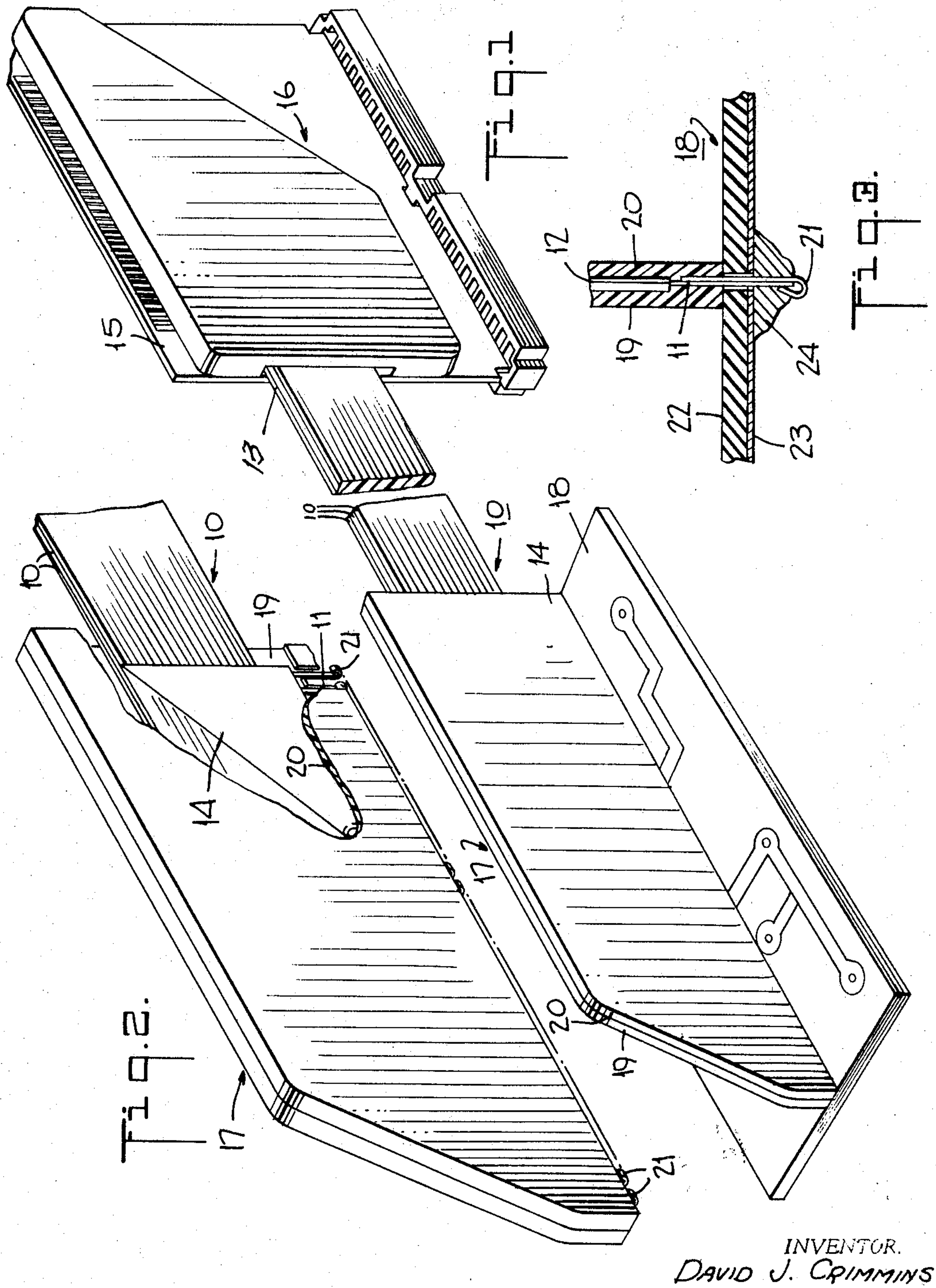
FIG. 1 illustrates an interconnection system of the invention having the spread pitch end of a cable mounted in a connector and attached to a printed circuit board and the fine pitch end attached to a connector card.
FIG. 2 illustrates a fragmentary view of the connector of FIG. 1 exposing the joint between the conductors of the cable and the pins of the connector.
FIG. 3 illustrates a cross sectional view of a joint formed between the spread pitch end of a cable and a printed circuit board.

Referring to FIG. 1, an interconnection system includes a plurality of flat cables 10 each of which is produced in a continuous process requiring no etchings. The cable 10 is composed of a plurality of conductors 11 each of which is formed of fully annealed rolled or drawn copper and coated with a self-extinguishing high strength polyester coating 12. The conductors 11 are spaced at a fine pitch end 13 of the cable with a pitch less than the pitch at the opposite spread pitch end 14 of the cable. For example, the spacing at the fine pitch end 13 is 0.062 inch while the spacing at the spread pitch end 14 is ⅛ inch. The fine pitch end 13 of the cable 10 is soldered to a connector card 15 with a strain relief 16 of the interconnection system and the spread pitch end 14 of the cable 10 is secured within a connector 17 for connection to a printed circuit board 18, such as a diode board.

Referring to FIG. 2, the connector 17 is made of two half sections 19, 20 which are sandwiched together and secured to each other as by built-in snap systems or by bonding. One of the half sections 19, 20, e.g. section 20 (cf. FIG. 3) of the connector 14 mounts a plurality of pins 21, for example, thirty-six pins in number, which project outwardly of the base of the connector 17 when the half sections are secured together. Each pin 21 is preformed in a generally J-shaped configuration with the stem portion secured to the section by any suitable conventional means. The hook end portion of each pin is formed to provide a small clearance between the stem portion and the end of the hook portion so that a conductor 11 can be inserted therebetween.

Referring to FIG. 3, in order to assemble the interconnection system on a printed circuit board 18 having a conductor path 23 disposed on one surface of an insulation board 22, the half sections 19, 20 of the connector 17 are separated, which separation is facilitated by a built-in snap system. Thereafter, the conductors 11 at the spread pitch end 14 of the cable 10, with the insulation 12 having been stripped and with the ends being tinned, are inserted into the hook end portions of each pin 21 to overlie the stem portions. Next, the hook end portions of the pins 21 are crimped to lock the conductors 11 in the pins 21 and to the half section of the connector 17. The crimping of the pins 21 on the conductors 11 is not electrical in nature in order to avoid damage to the conductors in a critical area. Furthermore, the pins 21 can be made of non-electrical material.

After securement to the pins 21, the end 14 of the cable 10 is folded in a right angle fold as shown and the other half section of the connector 17 is secured in place. The connector 17 is then inserted into the printed circuit board 18 so that the pins 21 and conductors 11 project through the board 22 to the conductor path side. With the connector 17 seated firmly on the circuit board 18, a wave soldering technique is performed to solder the pins 21 and conductors 11 to the conductor path side of the circuit board 18 to form a connection. The solder 24 provides an electrical connection between the conductors 11 and the respective conductor paths 23.

The interconnection system while eliminating a joint at the rear of the pins 21 to increase reliability also provides the necessary strain relief for the cable 10. Further, since soldering of the cable and connector to a printed circuit board can be performed in the field, a highly reliable interconnection system can be provided at very low cost.

Figures 4, 5, 6:
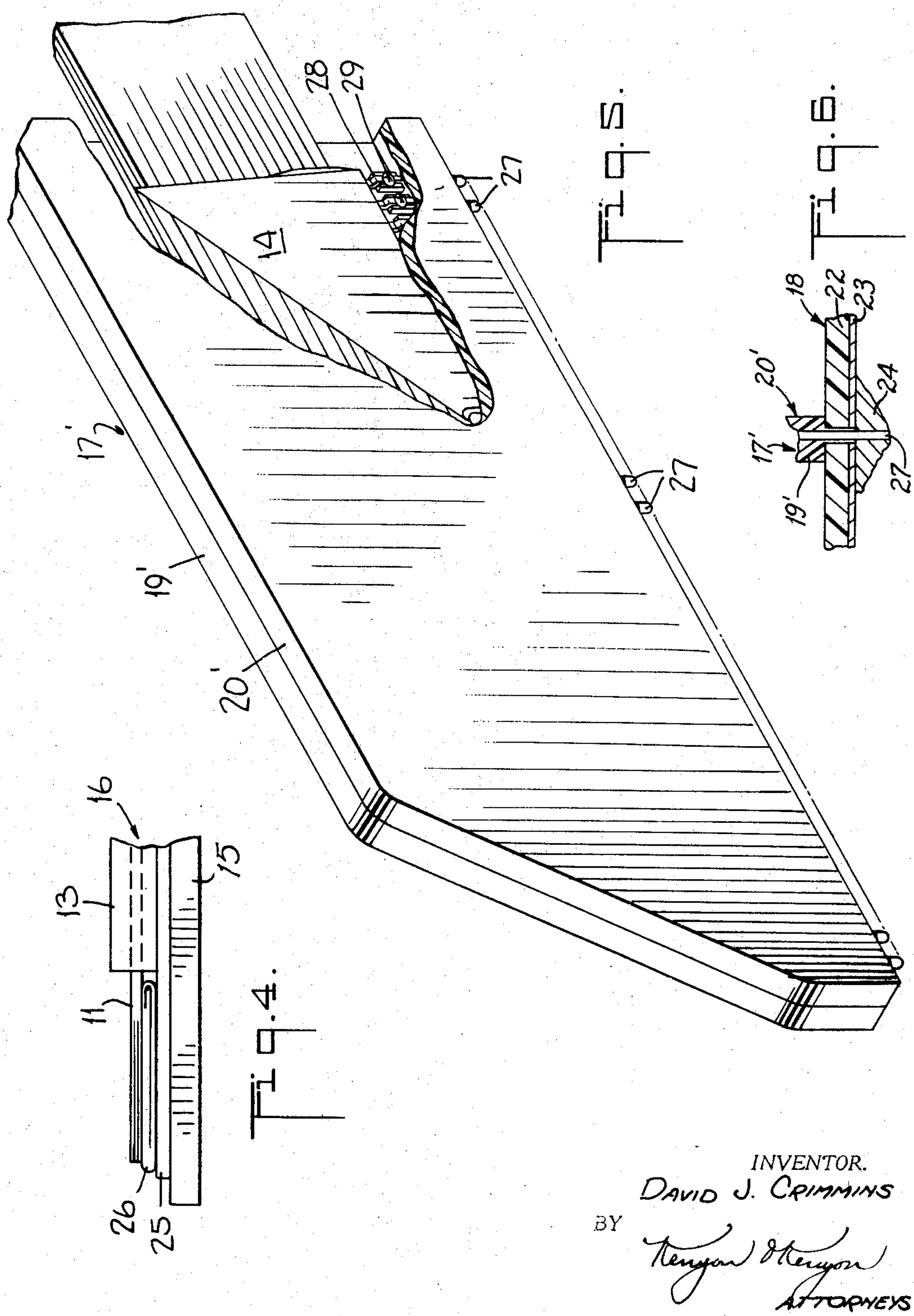
FIG. 4 illustrates a cross sectional view of the connection between the fine pitch end and connector card of FIG. 1.
FIG. 5 illustrates a modification of the terminal connection of the conductors to the pins of the connector.
FIG. 6 illustrates a cross sectional view of a joint formed between the pins of FIG. 5 and a circuit board.

Referring to FIG. 4, in order to connect the fine pitch end 13 of the cable 10 to connector card 15 having a circuit path 25 on one side, the portions of the conductors 11 projecting from the strain relief 16 are laid in generally aligned parallel relation over the respective circuit paths 25 and a lap solder joint 26 is made between the conductors 11 and circuit paths 25.

Referring to FIG. 5, where a high degree of reliability is not required, a connector 17' is provided with electrically conductive pins 27 having flat heads 28 secured within the half sections 19', 20' and the ends of the conductors 11 after being stripped of insulation are lap soldered to the heads 28. The solder 29 provides a mechanical connection as well as an electrical connection between the conductors 11 and pins 27.

Referring to FIG. 6, wherein like reference numerals have been used to indicate like parts above, each pin 27 of the connector 17' is mechanically and electrically secured by a solder 24 to the conductor path 23 of a circuit board 18.

The invention provides an interconnection system which utilizes techniques of spread pitch and direct conductor termination to replace the heretofore used flexible etched circuitry. The interconnection system is highly reliable, especially during flexure, in the area of the pin termination as well as being compatible with existing hardware in present use. Also, since the ends of the cables are retained with a connector, any flexure of the remainder of the cable is not transmitted to the ends of the cable. In addition, the interconnection system is simple and efficient, and is economically produced and utilized.

Having thus described the invention, it is not intended that it be so limited as changes may be readily made therein without departing from the scope of the invention.

According, the subject matter described above and shown in the drawings is to be interpreted as illustrative and not in a limiting sense.

What is claimed is:

1. In an interconnection system for a circuit board having a plurality of conductor paths thereon comprising a flat cable having a plurality of conductors therein, said cable having a spread pitch end folded in a right angle fold with said conductors projecting from said end of said cable;

a connector having a pair of half sections secured together securing said end of said cable therein to contain said fold therein, said conductors projecting from said connector; and a plurality of pins mounted in said connector and projecting therefrom, each of said pins being secured to a respective conductor of said plurality of conductors.

2. An interconnection system comprising a circuit board having at least one conductor path thereon,

3. An interconnection system as set forth in claim 2 wherein said J-shaped pins are electrically non-conductive and wherein said conductor end is electrically connected to said conductor path.

a flat cable having at least one conductor therein having an end projecting from one end of said cable, a connector having a pair of half sections secured together securing said one end of said cable therein, a pin mounted in one of said half sections and passing through said circuit board, said pin being of J-shaped configuration having a hook end portion and a stem portion, said conductor end being locked between said hook end portion and said stem portion of said pin, and means mechanically and electrically connecting said conductor end to said conductor path on said circuit board adjacent said hook end portion of said pin.

4. In combination with a printed circuit board having a plurality of conductor paths on one side thereof; an interconnection system having a flat cable composed of a plurality of conductors, said conductors being spaced apart at one end of said cable more than at the opposite end of said cable to form a spread pitch end, a connector having a plurality of sections secured together to contain said spread pitch end of said cable, and means electrically connecting each of said conductors in said connector to a respective one of said conductor paths, said means including a plurality of pins mounted on one of said sections and projecting outwardly of said connector, each of said pins being locked on a respective conductor of said plurality of conductors, said locked conductors and pins projecting through said printed circuit board in alignment with said conductor paths.

5. The combination as set forth in claim 4 wherein said means further includes a solder joint electrically connecting said projecting conductors and said circuit paths, said solder joint being disposed on a side of said printed circuit board opposite from said connector.

6. The combination as set forth in claim 4 wherein said pins are J-shaped with a hook end portion and a stem portion, each of said conductors being locked between said hook end portion and said stem portion.

7. The combination as set forth in claim 4 further comprising a connector card having a plurality of conductor paths thereon, wherein said conductors are spaced apart at said opposite end of said flat cable to form a fine pitch end, the conductor ends at said fine pitch end projecting over said conductor paths of said connector card in parallel alignment; and second means electrically connecting said conductor ends at said fine pitch end to said conductor paths of said connector card.

8. The combination as set forth in claim 7 wherein said second means is a lap solder joint.

9. In combination with a printed circuit board having a plurality of conductor paths on one side thereof; an interconnection system having a flat cable composed of a plurality of conductors, said conductors being spaced apart at one end of said cable more than at the opposite end of said cable to form a spread pitch end, a connector having a plurality of sections secured together to contain said spread pitch end of said cable, and means electrically connecting each of said conductors in said connector to a respective one of said conductor paths, said means including a plurality of pins mounted on one of said sections and projecting outwardly of said connector through said circuit board, each of said conductors being electrically and mechanically secured to one of said pins within said connector, said pins being in alignment with said conductor paths, and a solder joint electrically and mechanically connecting said pins to said conductor paths.

10. The combination as set forth in claim 9 wherein each of said pins has a flat head secured to a respective conductor.

11. The combination as set forth in claim 10 wherein a lap solder joint secures said heads and said conductors.

References Cited

UNITED STATES PATENTS

| | | | |
|---|---|---|---|
| 2,854,502 | 9/1958 | Richter. | |
| 2,958,064 | 10/1960 | Swengel. | |
| 3,105,729 | 10/1963 | Rosenthal et al. ------ | 339—18 |
| 2,981,918 | 4/1961 | Gluck et al. | |
| 3,027,417 | 3/1962 | Turner. | |

OTHER REFERENCES

ACI Bulletin E5, March 1963, pp. 12 and 13.

MARVIN A. CHAMPION, Primary Examiner

P. A. CLIFFORD, Assistant Examiner

U.S. Cl. X.R.

174—68.5; 339—196

UNITED STATES PATENT OFFICE
CERTIFICATE OF CORRECTION

Patent No. 3,508,187 April 21, 1970

David J. Crimmins

It is certified that error appears in the above identified patent and that said Letters Patent are hereby corrected as shown below:

Column 4, line 1, "According" should read -- Accordingly --; line 22, beginning with "3. An" cancel all to and including "said pin." in line 38 and insert:

a flat cable having at least one conductor therein having an end projecting from one end of said cable, a connector having a pair of half sections secured together securing said one end of said cable therein, a pin mounted in one of said half sections and passing through said circuit board, said pin being of J-shaped configuration having a hook end portion and a stem portion, said conductor end being locked between said hook end portion and said stem portion, said conductor end being locked between said hook end portion and said stem portion of said pin, and means mechanically and electrically connecting said conductor end to said conductor path on said circuit board adjacent said hook end portion of said pin.

3. An interconnection system as set forth in claim 2 wherein said J-shaped pins are electrically non-conductive and wherein said conductor end is electrically conducted to said conductor path.

Signed and sealed this 29th day of December 1970.

(SEAL)
Attest:

EDWARD M.FLETCHER,JR.
Attesting Officer

WILLIAM E. SCHUYLER, JR.
Commissioner of Patents